United States Patent [19]
Vatis et al.

[11] Patent Number: 4,682,106
[45] Date of Patent: Jul. 21, 1987

[54] METHODS OF, AND APPARATUS FOR, PROTON DECOUPLING IN NUCLEAR MAGNETIC RESONANCE SPECTROSCOPY

[75] Inventors: Dimitrios Vatis, Schenectady; Paul A. Bottomley, Clifton Park; Thomas H. Foster, Schenectady, all of N.Y.

[73] Assignee: General Electric Company, Schenectady, N.Y.

[21] Appl. No.: 714,405

[22] Filed: Mar. 21, 1985

[51] Int. Cl.[4] .......................................... G01R 33/08
[52] U.S. Cl. .................................................. 324/307
[58] Field of Search ................ 324/307, 309, 311, 322

[56] References Cited

U.S. PATENT DOCUMENTS 4,470,014 9/1984 Levitt et al. ......................... 324/311

OTHER PUBLICATIONS

"Polarization of Nuclei in Metals", Overhauser, *Physical Review*, 92, No. 2, pp. 411–415 (1953).
"Nuclear Magnetic Double Resonance with an Incoherent Radio-Frequency Field", Ernst, J. Chem. Phys., 45, No. 10, pp. 3845–3861 (1966).
"Multiple-Pulse NMR Experiments", Waugh et al., J. Chem. Phys. 48, pp. 662–670 (1968).
"Spin-Decoupling in the Resolution of Chemical Shifts in Solids by Pulsed N M R", Mehring et al. J. Chem. Phys. 54, pp. 3239, et seq. (1971).
"Coherent Broad-Band Decoupling-An Alternative to Proton Noise Decoupling in Carbon-13 Nuclear Magnetic Resonance Spectroscopy", Grutzner et al., J. Magn. Reson. 19, pp. 173–187 (1975).
"Composite Pulse Decoupling", Levitt et al., J. Magn. Reson. 43, pp. 502–507 (1981).
"Removal of Residual Splitting in Nuclear Magentic Double Resonance", Anderson et al., J. Chem. Phys. 39, No. 1, pp. 183–189 (1963).
"Utilization of Chirp Frequency Modulation with 180°-Phase Modulation for Heteronuclear Spin Decoupling", Basus et al., J. Mag. Reson., 35, pp. 19–37 (1979).
"Theory of Broadband Spin Decoupling", J. S. Waugh, J. Mag. Reson., 50, pp. 30–49 (1982).

*Primary Examiner*—Michael J. Tokar
*Assistant Examiner*—Francis J. Jaworski
*Attorney, Agent, or Firm*—Geoffrey H. Krauss; James C. Davis, Jr.; Marvin Snyder

[57] ABSTRACT

A method for proton decoupling, nuclear Overhauser enhancement and/or in selective saturation magnetic resonance spectroscopy, particularly relevant to in vivo spectroscopic imaging, utilizes a radio-frequency pulse modulated with a truncated (sinc X)/X function capable of being windowed. The radio-frequency pulse is tuned to the frequency of the nuclear species, such as $^1H$, to be decoupled or saturated and has a bandwidth adjusted to correspond to the entire chemical shift spectrum of the nuclear species to be decoupled, minimizing the amount of radio-frequency power transmitted into a volume of the irradiated sample. Several methods, and several embodiments of apparatus, for forming the required radio-frequency pulse, are disclosed.

38 Claims, 13 Drawing Figures

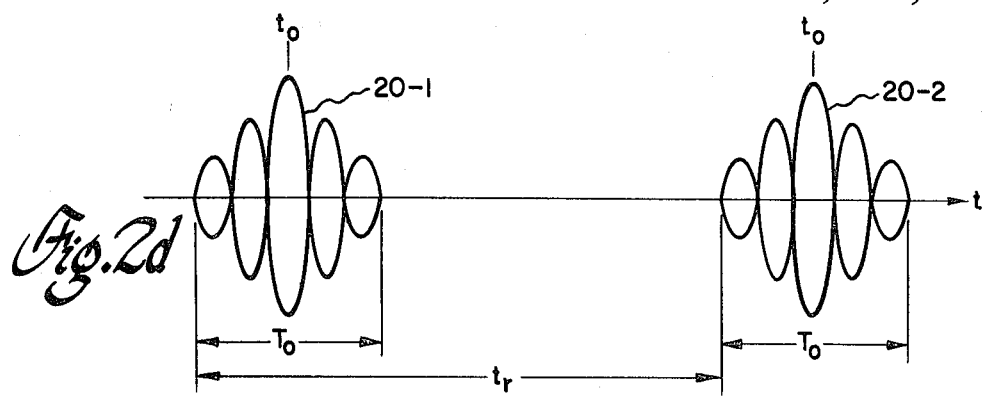
Fig.2d
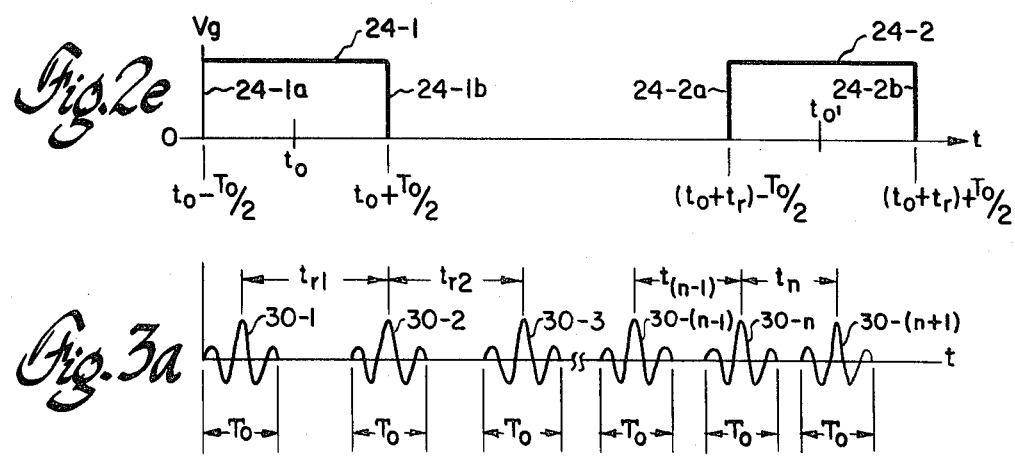
Fig.2e
Fig.3a
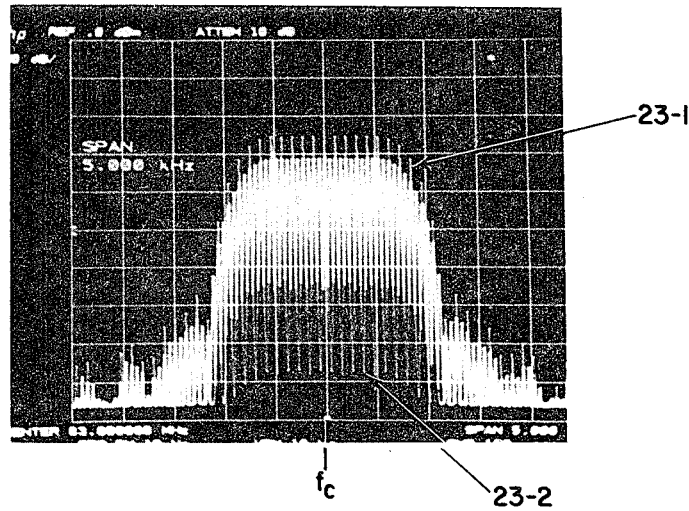
Fig.3b

METHODS OF, AND APPARATUS FOR, PROTON DECOUPLING IN NUCLEAR MAGNETIC RESONANCE SPECTROSCOPY

BACKGROUND OF THE INVENTION

The present invention relates to nuclear magnetic resonance (NMR) spectroscopy and, more particularly, to novel methods of, and apparatus for, decoupling a first coupled nuclear species from the magnetic resonance response signals from a second desired species, and especially for providing at least one, or several (if applicable), of decoupling and/or nuclear Overhauser enhancement and/or selective saturation (in saturation transfer experiments) with in vivo spectroscopic imaging.

It is now relatively well known, among those skilled in the medical diagnostic imaging arts, than carbon-13 ($^{13}C$) nuclear magnetic resonance spectroscopy may offer promise as a technique for the study of human metabolic processes in vivo. However, $^{13}C$ in vivo spectroscopy is, even if the proper high-field magnetic system is provided with the necessary spatial and temporal stability for spectroscopic imaging, not without difficulties; $^{13}C$ is a low-abundance and low-sensitivity nucleus, and acquiring spectra therefrom with adequate signal-to-noise ratio is relatively difficult. The acquisition of suitable $^{13}C$ spectra is often further complicated by the spectral line splitting resulting from dipolar interactions between the $^{13}C$ nuclei and the $^{1}H$ nuclei (protons). Minimization of spectral line splitting by spin decoupling techniques, wherein the sample is irradiated over the proton chemical shift spectrum at the same time as the $^{13}C$ experiment is being carried out, was proposed by F. Bloch, in "Recent Developments in Nuclear Induction", Phys. Rev. 93, 944 (1955). The spin decoupling technique effectively saturates the proton $^{13}C$ spectra; this collapse of the multiplet structure results in a more easily interpreted spectrum while also improving the signal-to-noise ratio by concentrating all of the signal of the multiplet in a single spectral line.

PRIOR ART

After the spin decoupling proposal of Bloch, a number of other methods have been proposed for effective and optimum decoupling: R. R. Ernst, in "Nuclear Magnetic Double Resonance with an Incoherent Radio-Frequency Field", J. Chem. Phys. 45, 3845 (1966), decoupled heteronuclear spin systems by means of strong sample irradiation by radiofrequency magnetic random noise; J. S. Waugh et al., in "Multiple-Pulse NMR Experiments", J. Chem. Phys. 48, 662 (1968), utilized a double resonance experiment decoupling technique of simultaneously subjecting the interfering spins (e.g. the $^{1}H$ spins) to a suitably-strong radio-frequency (RF) perturbation at their characteristic resonance, or Larmor, frequency; J. B. Grutzner et al., in "Coherent Broadband Decoupling-An Alternative to Proton Noise Decoupling in Carbon-13 Nuclear Magnetic Resonance Spectroscopy", J. Magn. Reson. 19, 173 (1975), utilized a broadbanded decoupling method in which phase modulation of the decoupler carrier frequency with a 50% duty-cycle square waveform was required; and M. H. Levitt et al., in "Composite Pulse Decoupling", J. Magn. Reson. 43, 502 (1981), utilized a composite pulse decoupling technique. The Waugh et al. technique was reported, by M. Mehring et al., in "Spin-Decoupling in the Resolution of Chemical Shifts in Solid Pulse NMR", J. Chem. Phys. 54, 3239 (1971), to be viable in a magnetic resonance study of a crystalline solid; additional apparent improvement in the signal-to-noise ratio appears to be obtainable, also for magnetic resonance studies of metallic solids, by the so-called Overhauser Enhancement effect, as reported by A. W. Overhauser, in "Polarization of Nuclei in Metals", Phys. Rev. 92, 411 (1953).

These techniques require relatively high RF power levels to produce effective results, which tends to heat the sample being studied; for spectroscopic imaging of living (and especially human) subjects, it is therefore very important to select a decoupling technique which produces the maximum decoupling effect (within a given bandwidth), while also utilizing the least possible RF power, to avoid any subject discomfort and/or spatial distortions due to tissue heating by excessive incident RF power.

BRIEF SUMMARY OF THE INVENTION

In accordance with the invention, a method for reducing the effects of a first coupled nuclear species upon magnetic resonance spectroscopy signals provided by a second, desired nuclear species, utilizes the steps of: providing a radiofrequency excitation signal at a center frequency substantially equal to the Larmor frequency of the coupled nuclear specie; modulating the amplitude of the center frequency signal with a sinc($\omega_0 t$) signal waveform; and adjusting at least one of the modulated RF signal amplitude and instantaneous center frequency, across a range of frequencies related to the passband frequency $\omega_0$ of the coupled specie, to provide an RF decoupling signal having at least one of a desired degree of coupled specie suppression and/or nuclear Overhauser enhancement. Preferably, the sinc($\omega_0 t$) envelope modulation signal is truncated to include the main lobe and a fixed number of sidelobes, typically the first two side lobes, both before and after the main lobe, thereof; the truncated excitation signal occurs in a time interval $T_0$ related to the desired excitation bandwidth $\omega_0$. The sinc($\omega_0 t$) function can be further modified, as by attenuation thereof away from the main lobe, by another function, such as by multiplication with a Hamming-window function or the like, to optimize the desired effect.

In presently preferred embodiments, the RF decoupling signal is provided by one of apparatus for: aperiodic repetition of RF pulses; providing a single-sideband-modulated carrier with frequency offset; or providing an RF carrier having low-frequency frequency modulation and subsequent amplitude-modulation, all within a chosen bandwidth of the Larmor frequency of the coupled first nuclear specie.

Accordingly, it is an object of the present invention to provide novel methods for decoupling a first and coupled nuclear species from the response MR signals from a second nuclear species.

It is another object of the present invention to provide novel apparatus for decoupling a first preselected nuclear species from affecting the response MR signals from a second nuclear species.

These and other objects of the present invention will become apparent upon reading of the following detailed description of the invention, when considered in conjunction with the drawings.

BRIEF SUMMARY OF THE DRAWINGS

FIGS. 2d and 2e are time-domain coordinated illustrations of a sequential pair of sinc-modulated RF decoupling pulses and of gating signals coordinated therewith, and useful in understanding aspects of the present invention;

FIG. 3a is a time-domain graphical illustration of an aperiodic, variable-time-interval, repetition decoupling signal, in accordance with a first presently preferred embodiment of the present invention;

FIG. 3b is a photograph of the resulting spectra produced by one example of the time-domain waveform of FIG. 3a;

FIG. 4b is a schematic block diagram of a presently preferred form of apparatus for providing the decoupling signal illustrated in FIG. 4a.

DETAILED DESCRIPTION OF THE INVENTION

Figure 1:
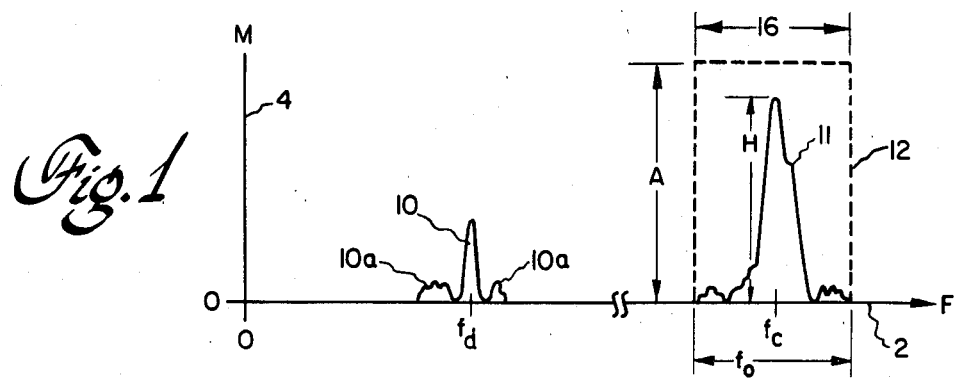
FIG. 1 is a graphical illustration of the frequency spectrum encountered in a typical magnetic resonance spectroscopy experiment, illustrating the nuclear specie response signal spectra.

Referring initially to FIG. 1, wherein increasing frequency F is shown along an abcissa 2, and increasing signal magnitude M is shown along an ordinate 4, it will be seen that a first, desired spectrum 10, produced by response signals from a first desired specie of stimulated nuclei can have undesired spectral content portions 10a, due to dipolar coupled interactions between the desired nuclei and a second, coupled nuclear specie, having its own magnetic-resonance response spectra 11. In particular, spectra of a desired nuclear specie, such as $^{13}C$, having a primary response frequency $f_d$, can be complicated by the proton ($^1H$)-carbon ($^{31}C$) coupling. The effect of undesired spectral portions 10a can be minimized by providing an excitation signal 12, having a bandwidth $f_0$, substantially centered about the resonance, or Larmor, center frequency $f_c$ of the coupled ($^1H$) nuclei specie, and of an amplitude A sufficient to effectively act upon the coupled nuclei resonance and eliminate the splitting of the desired resonance spectra. Such a procedure decouples the coupled nuclear specie from the desired specie and is known to result in a more easily interpreted desired-spectrum and also to improve the signal-to-noise ratio thereof, by concentrating all of the desired specie response signals in a single spectral line.

Figure 2A:
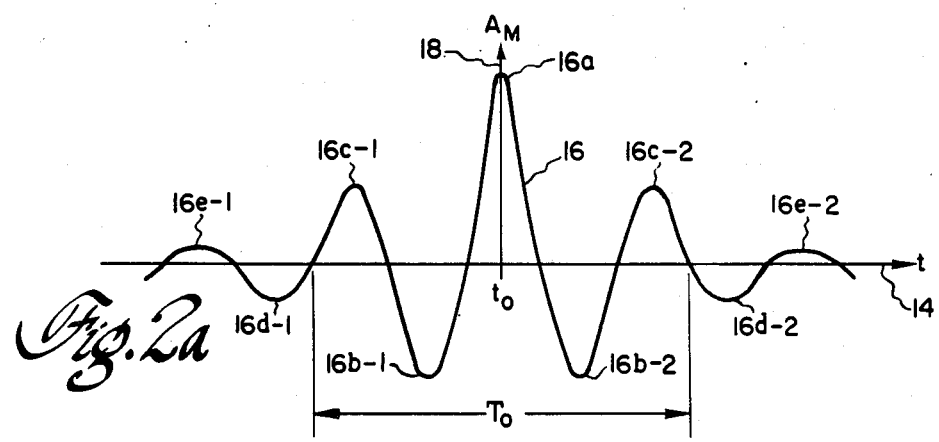
FIG. 2a is an amplitude-time graphical illustration of a sinc-function modulation envelope, to be utilized in accordance with one aspect of the present invention.

In order to maximize the decoupling effects of signal 12, while minimizing the amount of radio-frequency (RF) power required therefor, we have found that the coupled specie can be irradiated with a carrier frequency $f_c$ signal having a modulation envelope $A_m(t)$ of the form:

$$A_m(t) = (\sin(\omega_0 t))/(\omega_0 t) = \operatorname{sinc}(\omega_0 t), \quad (1)$$

where t is time and $\omega_0$ determines the desired decoupling signal bandwidth (i.e. $\omega_0 = 2\pi f_0$). This modulation envelope is shown in FIG. 2a, wherein time t is plotted along abscissa 14, for times before and after the time $t_0$ at which the maximum-amplitude lobe 16a of the modulation waveform 16 occurs; the relative amplitude $A_m$ is plotted along ordinate 18. It will be seen that the $\operatorname{sinc}(\omega_0 t)$ modulation signal waveform 16 is an even periodic function, about time $t_0$, having alternating-polarity peaks 16b, 16c, 16d, 16e, ... of decreasing amplitude, for times increasingly removed from the modulation signal waveform center time $t_0$. In particular, four pair of side lobe peaks, e.g. side lobe peaks 16b-1, 16c-1, 16d-1 and 16e (for times prior to center time $t_0$) and side lobe peaks 16b-2, 16c-2, 16d-2 and 16e-2 (for times after center time $t_0$) are shown. While an infinite number of such side lobes in the time-domain sinc-modulation signal are necessary to provide the perfectly-rectangular saturation decoupling envelope of signal 12 (FIG. 1), this is impractical; we have determined that a truncated modulation waveform in definite time interval $T_0$, which interval includes main lobe 16a and the first two pair of adjacent side lobes 16b-1, 16b-2, 16c-1 and 16c-2, can define an irradiated bandwidth $f_0$ in which adequate decoupling can be achieved.

Figure 2B:
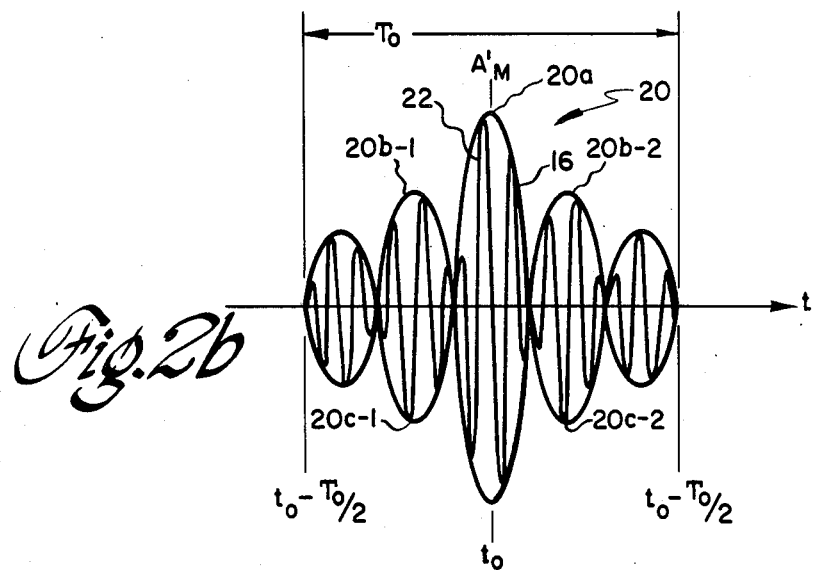
FIG. 2b is a graphical illustration of a truncated five-lobe sinc-modulated RF carrier in accordance with principles of the present invention.

The resulting modulated RF carrier signal 20 is illustrated in FIG. 2b. It will be seen that the absolute value of the amplitude $A_m'$ of the modulation envelope is the absolute value of the truncated $\operatorname{sinc}(\omega_0 t)$ modulating waveform 16, over the time interval $T_0$, and that the instantaneous amplitude is that of the coupled nuclear species carrier frequency signal waveform 22. It will also be seen that, due to the reversal of envelope polarity associated with first side lobes 16b-1 and 16b-2, the modulated signal lobes 20b-1 and 20b-2 are of opposite phase from the phase of the modulated RF signal in the main lobe 20a and the second side lobes 20c-1 and 20c-2. There is essentially no RF energy present either before time $(t_0 - T_0/2)$ at which the modulated RF waveform 20 commences, or after time $(t_0 + T_0/2)$ at which the pulse of modulated RF energy terminates. It may be desirable to further attenuate the modulated signal amplitude, at various times t with respect to center amplitude 20 at time $t_0$; for example, multiplication of the $\operatorname{sinc}(\omega_0 t)$ function by a Hamming-window function, or the like, can be used to sharpen the frequency spectrum of signal 20.

Figure 2C:
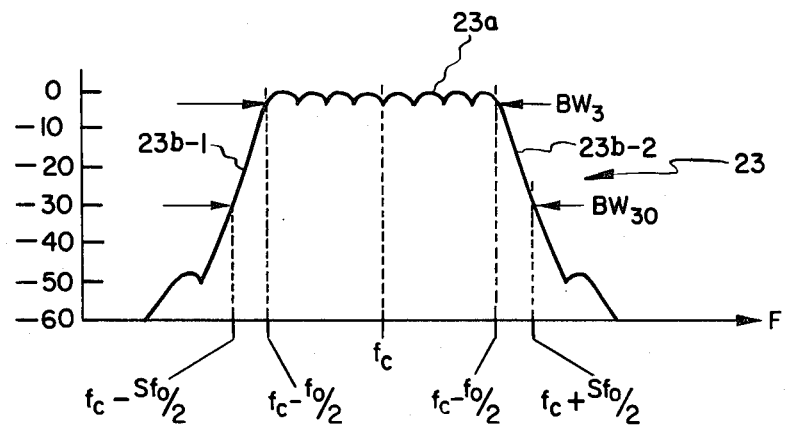
FIG. 2c is a graphical illustration of the frequency spectrum of the decoupling RF single pulse signal of FIG. 2b.

FIG. 2c illustrates the frequency spectrum of a single sinc-modulated RF pulse signal 20, at a Larmor frequency $f_c$ of the coupled specie; the duration $t_0$ of the pulsed signal has been adjusted to provide a three-dB. bandwidth ($BW_3$) essentially equal to the desired rectangular bandwidth $f_0$ (FIG. 1). It will be seen that the actual spectrum 23 has a rippled top portion 23a, rather than the desired constant amplitude A of signal 12, and has sloping lower and upper skirt portions 23b-1 and 23b-2, respectively, with a shape factor S of about 1.25:1 for the ratio of the 30 dB. bandwidth ($BW_{30}$) to $BW_3$, instead of the ideal shape factor $S'=1:1$ of the ideal decoupling signal 12. Therefore, as long as both the minimum signal level in portion 23a and the bandwidth $f_0$ are adjusted to be at least those minimum values required to provide the desired decoupling effect, the non-ideal but relatively steep skirt portions 23b mean that the required energy provided is minimized to the sample and the pulse signal approaches minimizing efficiency. However, spectrum 23 is further modified when the sinc-modulated RF signal is applied periodically, as is the case in actual magnetic resonance spectroscopy pulse signal sequences.

Figure 2F:
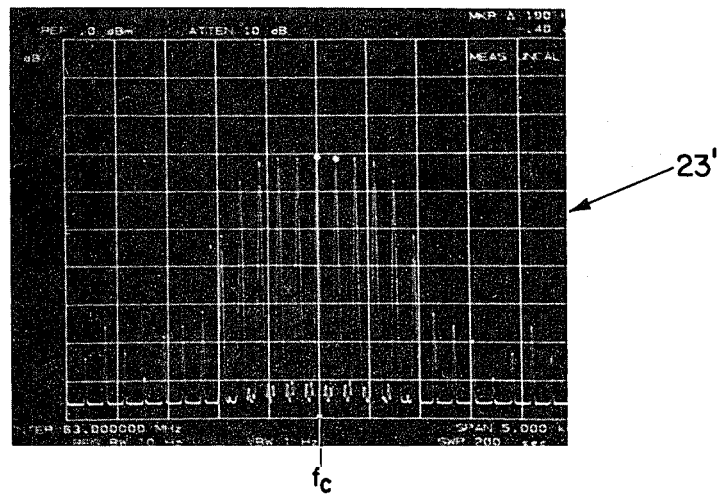
FIG. 2f is a photograph of the frequency-domain content of one particular modulated RF signal sequence, and useful in appreciating other aspects of the present invention.

In actual spectroscopy experiments, a relatively large number of sequential individual irradiations of the sample are required to collect sufficient signal (from either a single location, for signal averaging to improve the signal-to-noise ratio, and/or from each of an array of locations, to provide a spectroscopic image) and/or to provide a desired decoupling effect. The effect of applying a large number of excitation signals to a specific nuclear specie in a time interval not exceeding the spin-lattice relaxation time ($T_1$) of that specie, is referred to as saturation. Therefore, each of the sequences in which the sample is irradiated (to evoke a spectroscopic response signal) requires at least one of the decoupling-/saturation RF signal pulses 20. The typical situation is illustrated, in part, by coordinated FIGS. 2d and 2e, respectively showing sequential decoupling/saturation pulses 20, e.g. first and second sequential decoupling-/saturation RF signal pulses 20-1 and 20-2, each having essentially the same time duration $T_0$, but separated in time by a sequence repetition time interval $t_r$, and equivalent to gating the sinc-modulated RF signal with a gating function $V_g$ (FIG. 2e) having rectangular gating pulses 24, e.g. first and second gating pulses 24-1 and 24-2, respectively gating RF signals 20-1 and 20-2, respectively, to assure that components thereof are not applied to the sample prior to the time at which leading edges 24-1a or 24-2a occur and are terminated at the time at which trailing edges 24-1b or 24-2b occur. Thus, the spectra of FIG. 2c, which requires that $t_r$ be at least many orders of magnitude greater than the Rf pulse length $T_0$ (and ideally requires $t_r = \infty$), does not obtain. The actual spectra, obtained from a spectrum analyzer display, is shown in FIG. 2f. For the particular illustrated spectrum, a repetition time interval $t_r$ of about 5 milliseconds was utilized; the separation $\Delta f$ between adjacent ones of the relatively narrow signal frequency spikes is inversely proportional to this time interval $t_r$, i.e. $\Delta f = 1/t_r$, and is about 200 Hz. for the illustrated 5-millisecond repetition interval. The actual bandwidth of each individual spectral line is relatively narrow, as the time duration $T_0$ of each individual modulated RF signal pulse 20 is of relatively short duration, e.g. at least an order of magnitude less than the inter-pulse repetition time interval $t_r$. It will be seen that the spectra of FIG. 2f, while having an envelope (joining the tips of the various spectral lines) which approximates the desired spectral envelope 23 of FIG. 2c, is actually a comb of spectral lines and is not a continuous Rf spectrum. Since both the number of spectral lines and the interline frequency gaps $\Delta f$ are defined by the pulse repetition rate, which is itself defined by other criteria of the magnetic resonance experiment, all of the "holes" between the spectral comb lines represent Larmor frequencies at which the coupled nuclear specie will not be affected by the decoupling pulse. Therefore, additional steps must be taken to substantially eliminate all of these spectral holes and provide an essentially continuous spectrum over the desired saturation bandwidth $f_0$. In accordance with one aspect of our invention the spectral comb lines are substantially continuously frequency-shifted by an amount sufficient to cause each spectral line to occur at least once over the frequency range between a first position of that spectral line, at a particular instant of time, and the frequency defined by the next adjacent spectral line at the same time instant, to synthesize an essentially continuous irradiation/saturation spectrum. Conversion of a spectral comb, itself provided by sequential repetitions of a sinc-modulated RF signal, by three presently preferred techniques will be presented:

APERIODIC REPETITION OF RF DECOUPLING/SATURATION PULSES

Referring now to FIG. 3a, a saturation/decoupling signal is provided by a sequence of sinc-modulated RF pulse signals 30-1, 30-2, 30-3, . . . , 30-(n−1), 30-n, 30-(n+1), . . . , each having the same time duration $T_0$, and wherein the signal repetition time interval $t_r$ is continuously changed, in the same manner, for each sequence of signal pulses 30. In the illustrated sequence, the inter-pulse repetition period $t_r$, between adjacent pulses 30, is gradually decreased from a greatest inter-pulse repetition time interval $t_{r1}$ (between first and second signal pulses 30-1 and 30-2) to a minimum inter-pulse repetition time interval $t_{rn}$ (between sequential signal pulses 30-n and 30-(n−1)). Thus, the temporal separation between each pair of pulse signals 30 (and the associated gating signal 24) continuously changes between a minimum value and a maximum value, or between a maximum value and a minimum value, in increments sufficiently small as to change the number and location of the spectral lines in such a manner that the spectrum holes are substantially eliminated. The effect of this aperiodic RF decoupling/saturation pulse repetition is illustrated in the spectrum analyzer display of FIG. 3b. In the illustrated spectrum, only two different repetition rates are utilized, and the pair of spectra therefore are superimposed to illustrate the effect of variable-rate signal pulses. To further illustrate the effect, the second one 23-2 of the two spectra, having a repetition interval $t_{r2}$ equal to one-half the repetition interval $t_{r1}$ of the first spectrum 23-1, was deliberately given a somewhat greater amplitude than the amplitude of the first spectrum, to aid visual discrimination therebetween. It will be seen that the lower-amplitude first spectrum 23-1 has twice the number of spectral line peaks as the number of spectral line peaks of the higher-amplitude second spectrum 23-2. Because the repetition rate of the signal providing the first spectrum is exactly one-half that of the signal sequence providing the higher-amplitude second spectrum, there are twice as many first spectra lines in the same bandwidth and every other one of the spectral lines of the first spectrum coincides with one of the spectral lines of the second spectrum. It will be observed, however, that the first spectrum in fact "fills in" holes in the second spectrum. It will understood that, if both spectra were of equal amplitude, as would be provided by having each of pulses 30 (FIG. 3a) of equal amplitude, the spectral envelope, between the tips of adjacent spectral lines will provide the desired passband signal 12. It will be further understood that the aforementioned continuous incremental change in inter-pulse repetition interval $t_r$ will fill in holes in the spectral comb lines, and will provide a substantially continuous spectrum, as long as the maximum inter-pulse interval $t_{r1}$ and the minimum inter-pulse interval $t_{rn}$ and the increment (or, stated in another fashion, the number (N+1) of pulses), are suitably selected. It should also be understood that even if the amplitude of all signal pulses 30 are not equal, only the degree of ripple induced in the bandwidth top portion 23a (see FIG. 2c) will be affected; the amplitude of the various pulses need be arranged only so that the energy supplied at the Larmor frequency of any particular undesired nucleus is sufficient to provide the desired degree of decoupling/saturation thereat. Further, the increment between any two adjacent inter-pulse repetition periods, e.g. between a first period $t_m$ and a next period $t_{m+1}$, can be adjusted in coordination with the degree of a pulse-pulse signal amplitude equality, as long as energy at any particular frequency is sufficient to have the desired effect.

Figure 3C:
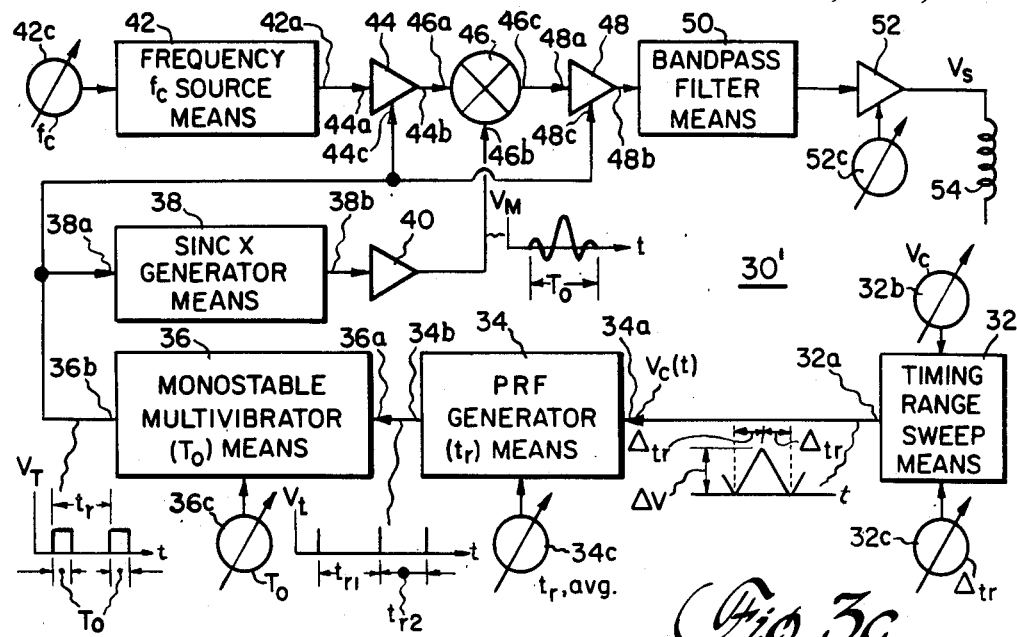
FIG. 3c is a schematic block diagram of a presently preferred form of apparatus for producing the time-domain signals of FIG. 3a and the frequency domain signals of FIG. 3b.

Referring now to FIG. 3c, a schematic block diagram illustrates one presently preferred embodiment of apparatus 30' for generating a periodic repetitive Rf signal pulses. A timing range sweep means 32 provides a substantially continuously changing control voltage $V_c(t)$ at an output 32a. The magnitude $\Delta V$ of the output voltage change can be varied by operation of a $V_c$ control 32b, while the time duration $\Delta t_r$ over which that voltage change occurs, can be varied by means of an associated control 32c. The control voltage $V_c(t)$ may be: a monotonically increasing voltage during each of a plurality of consecutive timing range time intervals $\Delta t_r$; a monotonically decreasing voltage during each of a plurality of consecutive timing range intervals; or alternately increasing and decreasing in alternating timing range intervals, as shown. The timing range time interval $\Delta t_r$ is of a duration given by the sum, for the first through N-th changing inter-pulse petition time intervals $t_{rm}$ (where m=1, 2, ..., N), plus the duration $T_0$ of the N+1-st pulse 30-(N+1) plus the time duration of any inter-sweep resting time, if used, at either the maximum or minimum control voltage magnitudes. As such inter-sweep resting time interval appears to serve no useful purpose, and as the pulse time $t_0$ is always less than even the minimum inter-pulse time interval, the range sweep time interval $\Delta t_r$ is approximately equal to the sum of the individual inter-pulse time intervals for a single sequence, i.e.

$$\Delta t_r \approx \sum_{m=1}^{n} (t_{rm}).$$

The control voltage $V_c(t)$ is provided at a frequency-control input 34a of a pulse repetition frequency (PRF) generator means 34, having an output at which a preselected signal change occurs with timing $t_r$. The average interpulse time $t_{r,avg}$ can be established by an associated control 34c, while the maximum and minimum inter-pulse times, the increments therebetween and the speed of incrementation are responsive to the timing range sweep voltage at frequency-control in put 34a. The incrementally-varying $t_r$ signal at output 34b is provided to a trigger input 36a of a monostable multivibrator means 36. Responsive to each trigger signal at input 36a a pulse appears at multivibrator means output 36b with a duration $T_0$, established by adjustment of an associated control 36c. The inter-pulse time interval $t_r$ therefore incrementally changes from a maximum to a minimum inter-pulse time interval, as set by timing range sweep means 32 and PRF generator means 34. The aperiodically repetitious sequence of pulses at multivibrator means 36b acts as the gate signal. The gate signal is applied to the input 38a of a sinc(x) function generator means 38. Function generator means 38 generates the truncated sinc(x) waveform over the gate signal time interval $T_0$; this generated function signal appears at output 38b, for amplification in an audio frequency amplifier means 40 to provide a modulation signal $V_M(t)$. Function generator means 38 may be any of the well-known class of read-only-memory (ROM)-based function generators, such as, illustratively, a generator having a pulse source, means for counting the pulses to derive a read-only-memory address, and a digital-to-analog converter means for converting the digital information from the ROM into the truncated sinc waveform. Generator means 38 may also include means for adjusting the pulse source frequency to assure that the counter means executes the required number of counts to cause the sinc(x) function voltage $V_M$ to be generated over the entire time interval $T_0$, with variation therein responsive to adjustment of control 36c. It should be understood that any monotonic function can be programmed into the ROM, e.g. the Hamming-windowed sinc function, or the like, can be so programmed.

A frequency source means 42 provides the nucleus center Larmor frequency $f_c$ signal at an output 42a thereof; the frequency $f_c$ may be adjusted by an associated control 42c. The RF signal from source means output 42a is applied to an input 44a of a first gated RF amplifier means 44; the amplified center frequency signal appears at an output 44b only during the presence of each gating $V_T$ pulse of time duration $T_0$ at a control input 44c. The gated center frequency RF signal pulse is applied to a first input 46a of a modulator means 46, having an amplitude-control input 46b receiving the sinc(x) function voltage $V_M$ from amplifier 40. Modulator means 46 acts as an analog multiplier, producing the sinc-modulated center frequency RF signal at an output 46c thereof. The modulated RF signal is applied to the input 48a of another gated amplifier means 48. The signal at the second gated amplifier means output 48b is responsive to the presence of the modulation time interval $T_0$ gating waveform $V_T$ at a control input 48c thereof (which gating voltage is the same as that at first gated amplifier means control input 44c and function generator input 38a, unless generator means 38 is controlled by the output signal of means 34). Thus, the center frequency carrier is modulated with the sinc envelope 30, with aperiodic repetitions thereof, which are gated to remove any tendency for the truncated modulation envelope to "ring" before or after time interval $T_0$. The aperiodically-repeated sinc-modulated undesired-species saturation pulse signal is then filtered in a bandpass filter means 50, having a passband at least as wide as the bandwidth $f_0$ of the passband 12 (see FIG. 1), to remove any sub-harmonic or harmonic content. The resulting signal is amplified to the proper power level by a power amplifier means 52 and is provided as a voltage $V_S$ signal to a coil means 54, forming part of the magnetic resonance spectroscopy system RF antenna subsystem (not shown). Thus, by appropriate adjustment of power amplifier output control 52c, center frequency control 42c, sinc-modulation time interval $T_0$ control 42c, average inter-pulse time interval $T_{r,avg}$ control 34c, control voltage amplitude $V_c$ control 32b and/or sweep range timing $\Delta t_r$ control 32c, all of the parameters of the aperiodically repeated RF saturation signal pulses, with truncated sinc modulation, can be varied to provide a desired degree of decoupling saturation and/or nuclear Overhauser enhancement.

SINGLE SIDEBAND (SSB) MODULATION WITH FREQUENCY OFFSET

Both sides of equation (1) can be multiplied by exp $(i\omega_1 t) = \cos(\omega_1 t) + i\sin(\omega_1 t)$, which yields a new modulation function PS(t):

$$PS(t) = PS_I(t) + PS_Q(t) = \sin(\omega_0 t) \exp(i\omega_1 t) \quad (2)$$

where $$PS_I(t) = \text{sinc}(\omega_0 t)(\cos(\omega_1 t)) \quad (3a)$$

and $$PS_Q(t) = \text{sinc}(\omega_0 t)(\sin(\omega_1 t)) \quad (3b)$$

where $\omega_1 = 2\pi f_1$, and $f_1$ is a small, but continuously varied, offset frequency utilized to move the $(\omega_0 = 2\pi f_0)$ comb-line frequencies with relation to the center frequency $f_c$ to eliminate holes in the excitation spectrum. Thus, by combining a pair of phase-quadrature signals (i.e. generating a single sideband RF signal) and offsetting the SSB signal substantially continuously over a range covering the frequencies between adjacent spectral lines of the comb-like non-offset SSB spectrum, (where those spectra lines are themselves separated by the $\Delta f$ frequency related to $\omega_0$), a continuous decoupling signal spectrum is provided. This is graphically illustrated in FIG. 4a, wherein the spectrum analyzer display shows that a first SSB spectrum 58a is provided substantially symmetrically about the desired center frequency $f_c$, for a value of $\omega_1$ substantially equal to the maximum offset value $\omega_{max}$. Here, the lower sideband is used, such that as offset frequency $f_1$ is decreased, until $\omega_1$ is substantially equal to zero, the single sideband signal gradually increases in frequency, at the same increasing incremental change as the decreasing incremental change in $\omega_1$, until a second spectrum 58b is obtained at the opposite end of the range of offset frequencies. It should be understood that the frequency offset may be in the opposite, e.g. decreasing, direction by either reselection of the minimum and maximum values of $f_1$, or by selection of the opposite sideband (i.e. the upper sideband). It will be seen that, as long as the offset frequency $f_1$ changes more slowly (and typically at least one order of magnitude less) than the bandpass-setting-frequency $f_0$ variation, each incremental shift in offset frequency $f_1$ will fill in additional hole portions of the non-offset frequency spectrum. By suitable choice of $F_0$, $f_1$, $f_c$ and signal amplitude, a particular nuclear specie can be decoupled from the specie (s) having spins of interest and/or the specie can be enhanced via the nuclear Overhauser effect.

Figure 4B:
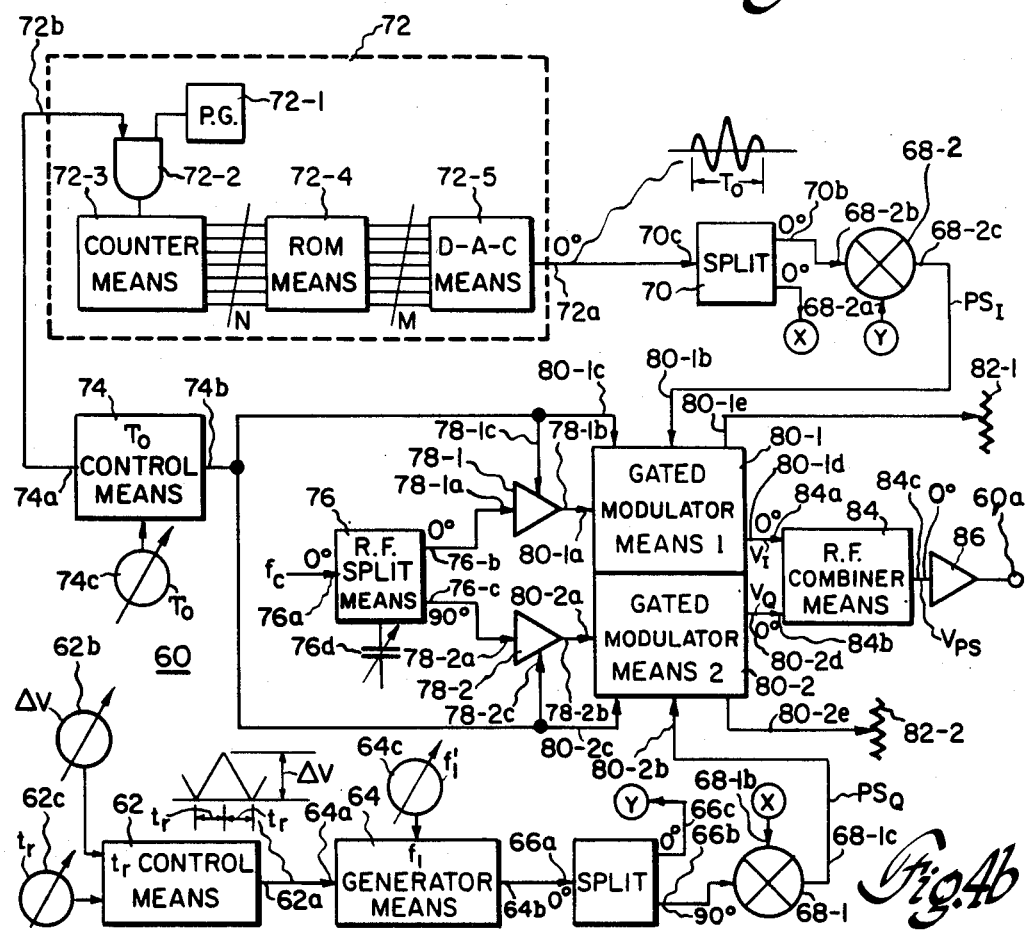
Figure 4A:
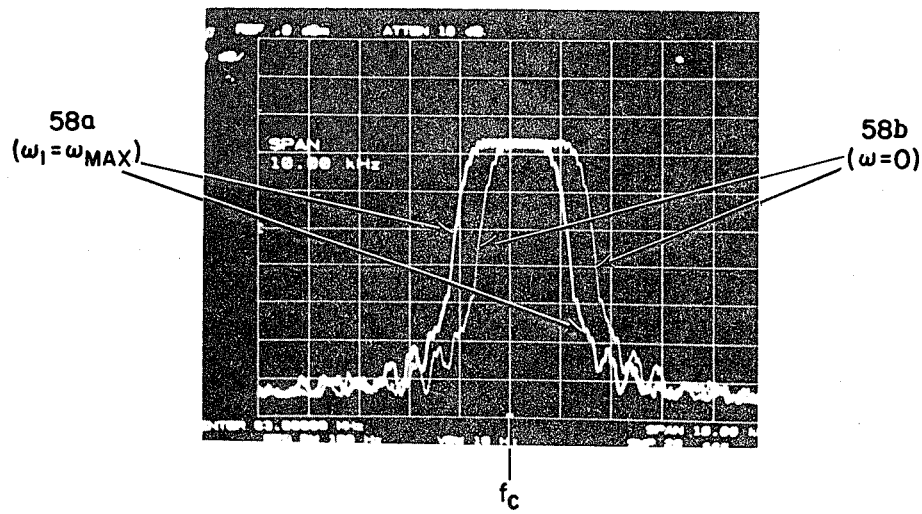
FIG. 4a is a pictorial illustration of the frequency-domain content of another presently-preferred form of decoupling RF pulse.
Figure 5:
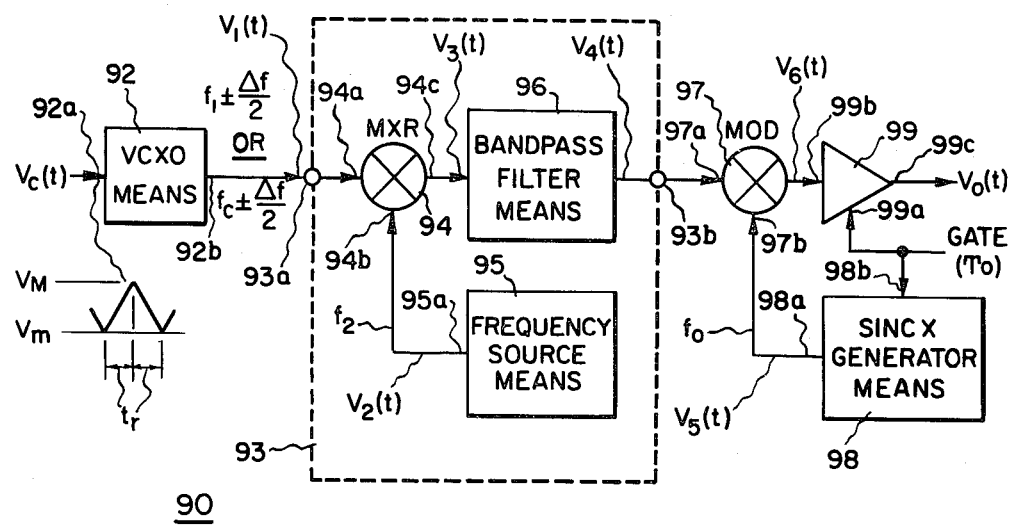
FIG. 5 is a schematic block diagram of still another presently preferred form of apparatus for producing a decoupling RF signal in accordance with the principles of the present invention.

FIG. 4b is a schematic block diagram of one presently preferred embodiment of apparatus 60 for generating a frequency-offset single-sideband RF suppression signal. Apparatus 60 includes a repetition interval $t_r$ control means 62 for providing a control voltage signal at an output 62a thereof, which control voltage signal monotonically varies over a range $\Delta V$ of amplitudes, which range can be established by means of an associated control 62b, during each repetition interval $t_r$ duration, as can be set by an associated control means 62c. The repetition interval $t_r$ signal at output 62a may be monotonically increasing or monotonically decreasing in each time interval $t_r$ (and would thus appear as sawtooth signal waveform) or may be alternatingly increasing and decreasing in alternating sequantial time intervals (providing a triangular waveform, as illustrated). The $t_r$ signal waveform is provided to an input 64a of a first frequency $f_1$ generator means 64, having the frequency of the signal at its output 64b set to an average frequency $(f_1')$ by an associated control 64c, and varied from a minimum $f_1$ frequency to a maximum $f_1$ frequency responsive to the maxima and minima of the control voltage at input 64a; for the illustrated spectra of FIG. 4a, the maxima and minima of the signal input 64a respectively set the generator means 64 output signal to the offset frequencies associated respectively therewith. The slowly varying first frequency $f_1$ signal is provided to the input 66a of a phase-quadrature splitter means 66. The varying audio frequency input waveform is provided with an essentially 90° phas shift at a first output 66b, for introduction to a first input 68-1a of a first analog multiplier (mixer/modulator) means 68-1; a second splitter means output 66c provides an output signal which resembles the input signal, having substantially zero phase shift therebetween, to a first input 68-2a of a second analog multiplier means 68-2. A second input 68-1b of the first analog multiplier means 68-1 is provided with a first in-phase signal from a first output 70a of a second signal splitter means, while a second output 70b provides a signal, of essentially the same phase as the signal at output 70a, to a second input 68-2 of the second analog multiplier means 68-2. The signal at the second signal splitter means input 70c is the truncated sinc-modulation envelope signal, as provided at the output 72a of sinc(x) generator means 72. This function generator means may be substantially identical to the function generator means 38 (of FIG. 3c) and might typically contain a pulse generator 72-1, a gating means 72-2 (receiving the pulses from pulse generator 72-1 and a gating $T_0$ signal from an input 72b) for controlling each time interval $T_0$ during which the pulse generator pulses are applied to the input of a counter means 72-3. As the count in counter means 72-3 increases and/or decreases, that digital count is carried by N data lines to the address input of a read-only-memory (ROM) means 72-4. Responsive to each different address sequentially accessed responsive to the count in counter means 72-3, ROM means 72-4 provides M parallel bits of data to the digital input of a digital-to-analog converter (DAC) means 72-5. Responsive to the changing digital data input, the DAC means provides an analog output signal at an output 72a thereof, for introduction to the second splitter means input 72c. By suitable encoding of the data in ROM means 72-4, and frequency setting of pulse generator 72-1, the truncated sinc-modulation waveform is synthesized at function generator output 72a. The duration of each occurrence of the sinc($\omega_0 t$) waveform is responsive to each pulse, of $T_0$ duration, provided to the function generator input 72b from a first output 74a of a $T_0$ control means 74. This control means also provides a second $T_0$ time interval pulse at another output 74b, with both pulses having their duration established responsive to an associated control 74c, and at a value selected to define the signal bandpass $f_0$.

The signal at function generator means output 64b is a sinusoid of instantaneous frequency $f_1$, i.e. $V(64b) - \cos(\omega_1 t)$. The signal Y at first splitter means second output 66c is therefore $Y=\cos(\omega_1 t)$, while the signal at output 66b is $\sin(\omega_1 t)$. As the signal at second splitter means input 70c is $\text{sinc}(\omega_0 t)$, the X signal at both first and second outputs 70a and 70b is substantially equal to $\text{sinc}(\omega_0 t)$. The first analog multipler signal output 68-1c is, therefore, $PS_Q=\text{sinc}(\omega_0 t)\cdot\sin(\omega_1 t)$, and the signal at the second analog multiplier output 68-2c is $PS_I=\text{sinc}(\omega_0 t)\cdot\cos(\omega_1 t)$.

The center frequency $f_c$ sinusoidal RF signal (which may be provided by a frequency source means such as means 42 of FIG. 3c, and the like) is provided to an input 76a of a radio-frequency splitter means 76. Splitter means 76 provides first and second outputs 76b and 76c at which the signals are of substantially equal amplitudes, but in phase quadrature with one another. The essentially 90° phase difference between the first output 76b and second output 76c signals of the splitter means 76 can be adjusted by action of an associated phase shift $\phi$ control 76d. The 0° signal at output 76b is connected to the input 78-1a of a first gated amplifier 78-1, while the 90° signal from output 76c is connected to the input 78-2a of a second gated amplifier 78-2. The respective gated amplifier outputs 78-1b and 78-2b are present only if an enabling signal appears at the respective control inputs 78-1c and 78-2c, which are connected together in parallel to $T_0$ control means output 74b. The first gated amplifier output is connected to the RF input 80-1a of a first gated modulator means 80-1, while the gated output of the second amplifier is connected to the RF input 80-2a of a second gated modulator means 80-2. The modulation signal inputs 80-1b and 80-2b of the respective first and second gated modulator means, respectively receive the $PS_I$ and $PS_Q$ signals from respective analog multiplier outputs 68-2c and 68-1c. The gated modulators each include a gating input 80-1c or 80-2c, also connected to the $T_0$ control means output 74b. Each of gated modulator means 1 and 2 provides a respective signal at an associated output 80-1d or 80-2d, which is present only when the modulator is gated on responsive to the gating signals at respect inputs 80-1c or 80-2c, and which output signal comprises the associated phase-quadrature RF signal introduced at the RF input 80-1a or 80-2a, respectively modulated by the PS signal introduced at the associated modulation input 80-1b or 80-2b, respectively. Each of the gated modulators may be of a balanced type, having an associated balancing input 80-1e or 80-2e, respectively connected to a balance control 82-1 or 82-2, for nulling the amount of center frequency $f_c$ carrier energy appearing at the output 80-1d or 80-2d, respectively. The first gated modulator output 80-1d signal $V_I$ and the second gated modulator output 80-2d signal $V_Q$ are respectively provided to the associated one of the first and second inputs 84a and 84b, respectively, of an RF combiner means 84. Gated modulator means 80 may be of the type described and claimed in copending application Ser. No. (714,406) U.S. Pat. No. 4,602,226 issued July 22, 1981, filed on even date herewith and incorporated herein in its entirety by reference. Combiner means 84 provides a single $V_{PS}$ at an output 84c thereof, with the respective input signals being linearly combined in-phase. Thus, the output signal provided to amplifier means 86 and thence to the apparatus output 60a (for coupling to an appropriate power amplifier and antenna, such as amplifier means 52 and antenna means 54 of FIG. 3c) is defined as:

$$V_{PS}=\text{sinc}(\omega_0 t)\sin((\omega_c-\omega_1)t) \quad (4)$$

where $\omega_c=2\pi f_c$. It should be understood that the latter expression can be changed to $\sin((\omega_c+\omega_1)t)$ by proper phasing to select the upper sideband. It will be seen that either single sideband signal $V_{PS}$ is the center frequency $f_c$ carrier signal modulated by the desired modulation function $\text{sinc}(\omega_0 t)\cdot\exp(i\omega_1 t)$, or, stated differently, the truncated sinc-modulated signal is varied over a frequency range from $(f_c\pm f_1)$ to $f_c$, as required to fill in substantially all of the "holes" in the required bandwidth $f_0$ of signal 12.

FREQUENCY-AMPLITUDE MODULATION

Equation 4 can be somewhat differently viewed as modulation, by the truncated $\text{sinc}(\omega_0 t)$ function, of the amplitude of a previously frequency-modulated signal of the $\sin((\omega_c-\omega_1)t)$ form; hence, the signal $V_{PS}$ may be somewhat more easily provided by consecutive frequency-modulation and then amplitude-modulation of the appropriate center frequency signal. Apparatus 90 utilizes the frequency-modulation, amplitude-modulation technique to provide the required signal $V_0(t)$.

Apparatus 90 utilizes a variable-crystal-controlled-oscillator (VCXO) means 92, having a frequency-control input 92a, at which a control signal $V_c(t)$ is provided, to change the frequency at the VCXO means output 92b. Advantageously, the control voltage $V_c(t)$ signal is of the triangular waveform type, having a minimum level $V_m$, corresponding to a minimum frequency and a maximum signal level $V_M$, corresponding to a maximum frequency, each of which extreme frequencies occur at opposite ends of one of a plurality of sequential sweep time intervals $t_r$. Thus, the average frequency of the signal at output 92b can be considered to be frequency $f_1$, with the control voltage varying the output signal instantaneous frequency over the range from a minimum of $(f_1-(\Delta f/2))$ to a maximum of $(f_1+(\Delta f/2))$. This frequency-modulated signal $V_1(t)$ is provided at an input 93a of a frequency-translation subassembly 93. Subassembly 93 comprises a mixer means 94 having a first input 94a receiving the frequency-modulated signal $V_1(t)$ from input 93a, and receiving another signal $V_2(t)$, at a frequency $f_2$ where $(2\pi f_2=\omega_2)$, at a second input 94b, from the output 95a of a stable frequency source means 95. The mixer output 94c contains a signal $V_3(t)$ of the form $\text{sinc}(\omega_2 t\pm(\omega_1\pm\Delta\omega/2)t)$, with $\Delta\omega=2\pi\Delta f$. The sum, or difference, product in output 94c signal $V_3(t)$ is selected by a suitable bandpass filter means 96, such that the signal $V_4(t)$ at the output 93b of the frequency-translation subassembly, is, for an up-converter subassembly 93, $V_4(t)=\sin(\omega_2 t+\omega_1 t+\Delta\omega t/2)$. It will be understood that the time interval $t_r$ over which the control voltage $V_c(t)$ changes is relativey long, with respect to one cycle of the frequency $f_1$ of VCXO means 92, and that the VCXO means frequency $f_1$ and the frequency source 95 frequency $f_2$ are selected such that the mixer sum/difference products are properly filterable by bandpass filter means 96. It will be understood that if the center frequency $f_c$ of the undesired nuclear specie can be provided with a particular VCXO means 92, that the voltage $V_1(t)$ at VCXO output 92b can be the actual center frequency ($\pm$frequency-modulation) output signal $V_4(t)$, and that the entire frequency-conversion subassembly 93 can be dispensed with. Since the rate of which the center frequency $f_c$ must be varied, by control voltage $V_c(t)$, is typically several orders of magnitude less than the center frequency, practical VCXO units are available for most Larmor frequencies, particularly those involved with magnetic resonance systems large enough for imaging of human patients.

Whether a single VCXO means 92 is utilized to directly provide $V_4(t) = \sin(\omega_c t \pm \Delta\omega t/2)$, or whether VCXO means 92 is combined with a frequency-translation means 93 to provide the signal $V_4(t) = \sin(\omega_2 t \pm \omega_1 t \pm \Delta\omega t/2)$, where one of $(\omega_2 \pm \omega_1) = \omega_c$ or $(\omega_2 + \omega_1) = \omega_c$, the resulting relatively-slowly frequency-modulated signal is applied to the first input 97a of an amplitude-modulator means 97 (which may be any appropriate analog multiplier and/or mixer means capable of operating at the desired center frequency $f_c$). A sinc(x) generator means 98 provides the sinc(x) signal $V_5(t)$ at a output 98a thereof, to a second input 97b of modulation means 97. The sinc($\omega_c t$) signal may be gated by a gate-time-interval $T_0$ signal at a gate input 98b, as required for synchronization. The resulting signal $V_6(t)$ at modulator output 97c is therefore of the form $\text{sinc}(\omega_0 t)\cdot\sin(\omega_c t \pm \Delta\omega t/2)$, as required. This signal is supplied to an RF input 99b of a gated RF amplifier 99, receiving the gating signal at its control input 99a, for providing a gated, amplitude-modulated, frequency-modulated signal $V_0(t)$ at its output 99c. This frequency-modulated/amplitude modulated signal is of the required $\text{sinc}(\omega_0 t) \sin((\omega_c - \omega_1)t)$ form, with gating through amplifier 99 serving to assure that properly-truncated sinc amplitude modulation appears on the final signal, so that a chosen degree of decoupling and/or nuclear Overhauser enhancement can be obtained with a generator requiring a relatively few subassemblies.

While several presently preferred methods of, and apparatus for, proton, or other nuclear specie decoupling and/or nuclear Overhauser enhancement in magnetic resonance spectroscopy, and particularly as applicable for in vivo human diagnostic imaging, have been set forth in detail herein, many variations and modifications will now become apparent to those skilled in the art, it is our intent, therefore, to be limited only by the scope of the appending claims and not by the specific details and instrumentalities presented by way of explanation and example herein.

What we claim is:

1. A method for selectively exciting the chemical shift spectrum of a first nuclear species which is coupled to a second nuclear species providing nuclear magnetic resonance (NMR) spectroscopy response signals from a sample, comprising the steps of:
   (a) providing a radio-frequency (RF) signal at a center frequency substantially equal to the Larmor frequency of the first nuclear specie;
   (b) modulating the amplitude of the RF signal with a time-dependent sinc($\omega_0 t$) signal waveform;
   (c) adjusting at least one selected one of (1) the amplitude of the modulated RF signal and (2) the instantaneous center frequency of the modulated RF signal, across range of frequencies related to the passband frequency $\omega_0$ of the first specie, to provide a radio-frequency decoupling signal;
   (d) coupling the decoupling signal to the sample to provide at least one selected one of (1) first specie decoupling and (2) nuclear Overhauser enhancement to the desired specie response signals therefrom; and
   (e) evoking an NMR response signal from the second nuclear specie.

2. The method of claim 1, wherein step (b) further comprises the step of: truncating the sinc($\omega_0 t$) modulation signal to occur in a predetermined time interval $T_0$ related to the desired bandwidth $\omega_0$.

3. The method of claim 2, wherein step (b) further comprises the step of: attenuating the modulation signal amplitude, for times removed from a main-lobe peak time $t_0$, to provide a sharpened frequency response.

4. The method of claim 2, wherein step (b) further comprises the step of: providing the sinc($\omega_0 t$) modulation signal to include only the main lobe and the first two pair of side lobes, with respect to the main lobe, in the time interval T.

5. The method of claim 2, wherein step (c) includes the step of: aperiodically repeating the truncated sinc($\omega_0 t$) modulaton signal with a repetition time interval $t_r$ incrementally changing from one of a predetermined maximum value and a predetermined minimum value to the remaining one of the maximum and minimum values, to vary the instantaneous frequencies of the amplitude-modulated radio-frequency signal over the first specie frequency passband.

6. The method of claim 5, wherein the minimum value of time interval $t_r$ is selected to be at least one order of magnitude greater than time interval $T_0$.

7. The method of claim 6, further comprising the step of: repeating at least step (c) for each excitation sequence exciting the second desired specie.

8. The method of claim 5, wherein a number (N+1) of truncated sinc($\omega_0 t$) RF signal pulses are provided, and further comprising the step of: incrementally changing the time interval $t_r$ by N increments over the range between the extrema thereof.

9. The method of claim 5, further comprising the step of: alternatingly sequentially incrementing the time interval $t_r$ change in opposite directions in each alternating one of each pair of time intervals.

10. The method of claim 2, wherein step (b) includes the step of generating the modulated radio-frequency signal as a single-sideband suppressed-carrier signal; and step (c) includes the step of adjusting the instantaneous center frequency of the single sideband signal to offset the apparent center frequency of that signal across a predetermined offset frequency range to substantially cover the frequencies within the first specie chemical shift spectrum.

11. The method of claim 10, wherein step (b) includes the step of generating a lower sideband signal; and step (c) includes the step of adjusting the offset frequency in decreasing manner to increase the modulated signal instantaneous center frequency across the first specie chemical shift spectrum.

12. The method of claim 10, wherein step (c) includes the step of: varying the offset frequency at a rate at least one order of magnitude less than the reciprocal of the modulation frequency.

13. The method of claim 10, wherein step (e) includes the step of: providing at least one excitation sequence for exciting the second specie; and step (c) further includes the step of: causing the offset frequency to deviate at least once over the predetermined range for each of the at least one excitation sequence exciting the second specie.

14. The method of claim 13, wherein step (c) further includes the step of: alternatingly modulating the offset frequency in opposite incremental directions in each alternating one of each pair of second specie excitations.

15. The method of claim 10, further comprising the step of: generating the single sideband signal by the phasing method.

16. The method of claim 2, wherein step (c) includes the step of: modulating the instantaneous center frequency of the signal, before amplitude modulation thereof by the truncated $\text{sinc}(\omega_0 t)$ signal, to deviate across a frequency band substantially equal to the first specie chemical shift spectrum.

17. The method of claim 16, wherein the deviation is substantially monotonic across the desired passband.

18. The method of claim 16, wherein step (e) includes the step of: providing at least one excitation sequence for exciting the second specie; and the deviation is alternatingly incremented in alternating directions, with respect to the no-deviation frequency, during each alternating one of a pair of excitation sequences, exciting the second specie.

19. The method of claim 16, wherein step (a) includes the steps of: generating the frequency-modulated signal at a first frequency different from the center frequency; and heterodyning the first frequency signal to the first specie center frequency, before the amplitude modulation step (b).

20. The method of claim 16, wherein step (a) includes the step of: generating the frequency-modulated signal directly at the first specie center frequency.

21. Apparatus for providing a radio-frequency signal having at least one selected one of (1) first specie decoupling and (2) nuclear Overhauser enhancement effect, upon a second nuclei specie in a sample in a nuclear magnetic resonance (NMR) experiment, comprising:
  means for providing a radio-frequency (RF) signal at a center frequency substantially equal to the Larmor frequency of a first specie, different from said second nuclear specie, in said sample;
  means for modulating the amplitude of the RF signal with a time-dependent $\text{sinc}(\omega_0 t)$ signal waveform;
  means for adjusting at least one selected one of (1) the amplitude of the modulated radio-frequency signal and (2) the instantaneous center frequency, across a range of frequencies related to a chemical shift spectrum $\omega_0$ of the first specie; and
  means for applying the adjusted signal to the sample to cause at least one selected one of (1) minimization of the coupling of the first nuclear specie to, and (2) nuclear Overhauser enhancement of, magnetic resonance spectroscopy response signals provided by the second nuclear specie.

22. The apparatus of claim 21, wherein the amplitude modulating means further comprises: means for providing the modulating $\text{sinc}(\omega_0 t)$ signal waveform as a truncated $\text{sinc}(\omega_0 t)$ modulation signal occurring in a predetermined time interval $T_0$ related to the frequency passband $\omega_0$.

23. The apparatus of claim 22, further comprising means for shaping the frequency response of said signal by attenuating the modulation signal amplitude in a predetermined manner for all times other than the time at which the modulating $\text{sinc}(\omega_0 t)$ waveform is at the peak of the main lobe thereof.

24. The apparatus of claim 22, wherein the amplitude modulating means further comprise: means for gating the $\text{sinc}(\omega_0 t)$ modulation signal to only include the main lobe and the first two pair of side lobes, with respect to the main lobe, in the time interval $T_0$.

25. The apparatus of claim 24, wherein said adjusting means further comprises: means for aperiodically repeating the truncated $\text{sinc}(\omega_0 t)$ modulation signal with a repetition time interval $t_r$ incrementally changing from one of a predetermined maximum value and a predetermined minimum value to the remaining one of the maximum and minimum values.

26. The apparatus of claim 25, wherein the aperiodically repeating means comprises: means for establishing the minimum time interval $t_r$ value; and means for establishing the value of time interval $T_0$ to always be at least one order of magnitude less than said time interval $t_r$ minimum value.

27. The apparatus of claim 26, further comprising: means for causing said aperiodically repeating means to operate responsive to each excitation sequence exciting the second specie.

28. The apparatus of claim 25, wherein the aperiodically repeating means includes: means for providing a number $(N+1)$ of signals, each causing said amplitude modulating means to modulate said center frequency signal with said $\text{sinc}(\omega_0 t)$ signal waveform; and means responsive to said $(N+1)$ pulses for incrementally changing the time interval $t_r$ over the range between the extrema thereof by N increments.

29. The apparatus of claim 25, further comprising: means for alternatingly sequentially incrementing the time interval $t_r$ change in opposite directions in each alternating one of each pair of time intervals $t_r$.

30. The apparatus of claim 24, wherein said amplitude modulating means includes: means receiving both said center frequency signal and said modulation signal for providing a single-sideband suppressed-carrier modulated radio-frequency signal; and means for adjusting, responsive to an incremental frequency $f_1$ signal, the instantaneous center frequency of the single sideband signal to offset the apparent center frequency substantially across the first specie chemical shift spectrum.

31. The apparatus of claim 30, wherein the single-sideband signal providing means includes: means for selecting a lower sideband signal; and said adjusting means includes: means for decreasing the offset frequency $f_1$ to increase the modulated signal instantaneous center frequency.

32. The apparatus of claim 30, wherein said offset frequency adjusting means includes: means for varying the offset frequency at a rate at least one order of magnitude less than the reciprocal of the modulation frequency.

33. The apparatus of claim 30, further comprising: means for offsetting the apparent center frequency of the modulated signal at least once over the first specie chemical shift spectrum for each excitation sequence exciting the desired specie.

34. The apparatus of claim 33, wherein the offsetting means alternatingly offsets the offset frequency in opposite incremental directions in each alternating one of each pair of first specie excitations.

35. The apparatus of claim 30, wherein the single-sideband signal generating means includes: first, second and third means each for splitting an input signal to provide a pair of output signals having a predetermined phase relationship therebetween; first and second mixing means each having a first input, a second input and an output; first and second modulator means each having a first input, a second input and an output at which appears the first input signal amplitude modulated by the second input signal; and a combining means for providing, at an output thereof, the sum of signals received at first and second inputs thereof; one of the center frequency signal, the sinc($\omega_0 t$) modulating signal and the offset frequency $f_1$ signal being provided to an associated one of said first, second and third splitter means inputs; the second splitter means outputs providing signals substantially in-phase, with each pair of output signals being coupled to a first input of a different one of said first and second mixing means; the first and third splitter means pair of outputs providing signals substantially in phase-quadrature; each output signal of said third splitter means being coupled to a different one of said first and second mixing means second inputs; each output signal of said first splitter means being coupled to a different one of said first and second modulation means first inputs; the output signals from each of said first and second mixing means being provided to a different second input of said first and second modulating means; and the output signals from said modulating means being independently coupled, each to a different input of said combining means for causing said single-sideband suppressed-carrier signal with frequency offset to appear at the combining means output.

36. The apparatus of claim 35, wherein at least said first and second modulator means are gated to each provide the output signal therefrom only during each modulation time interval $T_0$.

37. The apparatus of claim 36, further comprising first and second gated amplifier means for each providing an associated one of the first splitter means output signals to the first input of the associated modulator means only during each modulation time interval $T_0$.

38. The apparatus of claim 24, wherein said adjusting means includes: means for modulating the instantaneous center frequency of the signal to deviate across a frequency band substantially equal to the undesired specie chemical shift spectrum; said frequency-modulated signal being then provided to said amplitude modulating means.

* * * * *